United States Patent
Jo et al.

(10) Patent No.: US 11,600,712 B2
(45) Date of Patent: Mar. 7, 2023

(54) FERROELECTRIC STRUCTURE INCLUDING A FERROELECTRIC FILM HAVING A NET POLARIZATION ORIENTED TO A POLARIZATION ENHANCEMENT FILM AND SEMICONDUCTOR DEVICE INCLUDING THE SAME

(71) Applicant: Samsung Electronics Co., Ltd., Suwon-si (KR)

(72) Inventors: Sanghyun Jo, Seoul (KR); Sangwook Kim, Seongnam-si (KR); Yunseong Lee, Busan (KR); Jinseong Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 38 days.

(21) Appl. No.: 16/691,772

(22) Filed: Nov. 22, 2019

(65) Prior Publication Data
US 2020/0203498 A1 Jun. 25, 2020

(30) Foreign Application Priority Data
Dec. 21, 2018 (KR) .................. 10-2018-0167586

(51) Int. Cl.
*H01L 29/51* (2006.01)
*H01L 27/06* (2006.01)
*H01L 49/02* (2006.01)

(52) U.S. Cl.
CPC ........ *H01L 29/516* (2013.01); *H01L 27/0629* (2013.01); *H01L 28/60* (2013.01); *H01L 29/513* (2013.01)

(58) Field of Classification Search
CPC ... H01L 29/516; H01L 27/0629; H01L 28/60; H01L 29/513; H01L 27/11507;
(Continued)

(56) References Cited

U.S. PATENT DOCUMENTS

| 4,919,633 A | 4/1990 | Yamazaki et al. |
| 6,756,236 B2 | 6/2004 | Ford et al. |

(Continued)

FOREIGN PATENT DOCUMENTS

| CN | 107342345 A | 11/2017 |
| JP | 2562585 B2 | 12/1996 |

(Continued)

OTHER PUBLICATIONS

J. Duarte et al. 'Compact Models of Negative-Capacitance FinFETs: lumped and distributed charge models' *IEEE*, 2016, pp. 30.5.1-30.5.4.

(Continued)

*Primary Examiner* — Nelson Garces
(74) *Attorney, Agent, or Firm* — Harness, Dickey & Pierce, P.L.C.

(57) ABSTRACT

A ferroelectric structure includes a first polarization enhancement film on a ferroelectric film, wherein the ferroelectric film has a first net polarization in a first direction oriented from the ferroelectric film toward the first polarization enhancement film. The first polarization enhancement film has a second net polarization in a second direction crossing the first direction.

15 Claims, 13 Drawing Sheets

(58) Field of Classification Search
CPC ............... H01L 29/40111; H01L 28/40; H01L 27/10805; H01L 29/6684; H01L 29/78391; H01L 27/11585–11597; G11C 11/22; G11C 11/221; G11C 11/223
See application file for complete search history.

(56) References Cited

U.S. PATENT DOCUMENTS

| | | | |
|---|---|---|---|
| 2015/0214322 A1* | 7/2015 | Mueller | H01L 21/0228 257/295 |
| 2016/0358915 A1 | 12/2016 | Flachowsky et al. | |
| 2018/0006129 A1 | 1/2018 | Xing et al. | |
| 2018/0182769 A1* | 6/2018 | Cheng | H01L 29/516 |
| 2019/0148540 A1* | 5/2019 | Wang | H01L 29/78391 257/321 |

FOREIGN PATENT DOCUMENTS

| | | |
|---|---|---|
| JP | 4172619 B2 | 10/2008 |
| JP | 2016213280 A | 12/2016 |
| KR | 100967110 B1 | 7/2010 |

OTHER PUBLICATIONS

S. Salahuddin and S. Datta 'Use of Negative Capacitance to Provide Voltage Amplification for Low Power Nanoscale Devices' *Nano Letters*, vol. 8, No. 2, 2008, pp. 405-410.

P. Aguado-Puente and J. Junquera 'Ferromagneticlike Closure Domains in Ferroelectric Ultrathin Films: First-Principles Simulations' *Physical Review Letters*, 2008, pp. 177601-1 -177601-4.

* cited by examiner

FERROELECTRIC STRUCTURE INCLUDING A FERROELECTRIC FILM HAVING A NET POLARIZATION ORIENTED TO A POLARIZATION ENHANCEMENT FILM AND SEMICONDUCTOR DEVICE INCLUDING THE SAME

CROSS-REFERENCE TO RELATED APPLICATION

This application claims the benefit of Korean Patent Application No. 10-2018-0167586, filed on Dec. 21, 2018, in the Korean Intellectual Property Office, the disclosure of which is incorporated herein in its entirety by reference.

BACKGROUND

1. Field

The present disclosure relates to a ferroelectric structure and a semiconductor device including the ferroelectric structure.

2. Description of Related Art

A ferroelectric is a substance in which polarization (or an electric field) remains semi-permanent even after a voltage applied to the substance reaches 0 V. Much research has been conducted to improve the performance of devices by applying this feature of ferroelectrics to semiconductor devices. For example, research has been conducted to apply, to memory devices, the feature of ferroelectrics in which polarization exhibits hysteresis with respect to the variation of voltage. In addition, research has been conducted into the use of ferroelectrics in low-power-consuming logic devices.

In addition to the intrinsic properties of ferroelectrics, owing to the discovery of $HfO_2$-based ferroelectrics that are friendly to semiconductor processes and very thin in the range of several nanometers (nm), it is expected that the application of ferroelectric-based devices will increase.

SUMMARY

Provided are ferroelectric structures having improved characteristics.

Provided are semiconductor devices having improved characteristics.

Additional aspects will be set forth in part in the description which follows and, in part, will be apparent from the description, or may be learned by practice of the presented embodiments.

According to an aspect of an embodiment, a ferroelectric structure may include a ferroelectric film and a first polarization enhancement film on a first surface of the ferroelectric film. The ferroelectric film may have a first net polarization in a first direction oriented from the ferroelectric film toward the first polarization enhancement film. The first polarization enhancement film may have a second net polarization in a second direction crossing the first direction.

In some embodiments, the first direction may be perpendicular to an interface between the ferroelectric film and the first polarization enhancement film.

In some embodiments, the second direction may be parallel to an interface between the ferroelectric film and the first polarization enhancement film.

In some embodiments, the ferroelectric structure may further include a second polarization enhancement film. A second surface of the ferroelectric film may be on the second polarization film. The second surface of the ferroelectric film may be opposite the first surface of the first polarization enhancement film. The second polarization enhancement film may have a third net polarization in a third direction that is opposite the second direction.

In some embodiments, the first polarization enhancement film may directly contact the first surface of the ferroelectric film. The first surface may be an upper surface of the ferroelectric film. The second polarization enhancement film may directly contact the second surface of the ferroelectric film. The second surface of the ferroelectric film may be a lower surface of the ferroelectric film.

According to an aspect of another embodiment, a semiconductor device may include a substrate, a ferroelectric film on the substrate, a first polarization enhancement film on the ferroelectric film, and an electrode film on the first polarization enhancement film. The substrate may include a first source/drain region and a second source/drain region in upper portions of the substrate. The first source/drain region and the second source/drain region may be spaced apart from each other. The ferroelectric film may be on a portion of the substrate between the first source/drain region and the second source/drain region. The ferroelectric film may have a first net polarization in a first direction oriented from the ferroelectric film toward the first polarization enhancement film. The first polarization enhancement film may have a second net polarization in a second direction crossing the first direction.

In some embodiments, the first direction may be perpendicular to an interface between the ferroelectric film and the first polarization enhancement film.

In some embodiments, the second direction may be parallel to an interface between the ferroelectric film and the first polarization enhancement film.

In some embodiments, the semiconductor device may further include a second polarization enhancement film between the substrate and the ferroelectric film. The second polarization enhancement film may have a third net polarization in a third direction opposite the second direction.

In some embodiments, the first polarization enhancement film may directly contact an upper surface of the ferroelectric film and the second polarization enhancement film may directly contact a lower surface of the ferroelectric film.

In some embodiments, the semiconductor device may further include a dielectric film between the second polarization enhancement film and the substrate. A material of the dielectric film may be different than a material of the ferroelectric film.

In some embodiments, the semiconductor device may further include a dielectric film between the substrate and the ferroelectric film. A material of the dielectric film may be different than a material of the ferroelectric film.

According to an aspect of another embodiment, a semiconductor device may include a substrate; a gate structure on the substrate, and a capacitor. The substrate may include a first source/drain region and a second source/drain region in upper portions of the substrate. The first source/drain region and the second source/drain region may be spaced apart from each other. The capacitor may be electrically connected to the first source/drain region. The capacitor may include a lower electrode, an upper electrode, a ferroelectric film between the lower electrode and the upper electrode, and a first polarization enhancement film between the ferroelectric film and the upper electrode. The ferroelectric film may have a first net polarization in a direction oriented from the ferroelectric film toward the first polarization enhancement film. The first polarization enhancement film may have a second net polarization in a direction crossing the first net polarization.

In some embodiments, the first net polarization may be in a direction that is perpendicular to an interface between the ferroelectric film and the first polarization enhancement film.

In some embodiments, the second net polarization may be in a direction that is parallel to an interface between the ferroelectric film and the first polarization enhancement film.

In some embodiments, the semiconductor device may further include a second polarization enhancement film between the ferroelectric film and the lower electrode. The second polarization enhancement film may have a third net polarization in a direction that is opposite the first net polarization.

In some embodiments, the first polarization enhancement film and the second polarization enhancement film may directly contact opposite surfaces of the ferroelectric film, respectively.

In some embodiments, the semiconductor device may further include a first dielectric film between the second polarization enhancement film and the lower electrode. A material of the first dielectric film may be different than a material of the ferroelectric film.

In some embodiments, the semiconductor device may further include a second dielectric film between the first polarization enhancement film and the upper electrode. A material of the second dielectric film may be different than the material of the ferroelectric film.

In some embodiments, the semiconductor device may further include a dielectric film between the ferroelectric film and the lower electrode, A material of the dielectric film may be different than a material of the ferroelectric film.

According to some example embodiments, a semiconductor device may include a lower electrode, an upper electrode on the lower electrode, and a ferroelectric film between the lower electrode and the upper electrode. The ferroelectric film may have a first net polarization in a direction oriented from the ferroelectric film toward the first polarization enhancement film. The first polarization enhancement film may be between the ferroelectric film and the upper electrode. The first polarization enhancement film may have a second net polarization in a direction crossing the first net polarization.

In some embodiments, the semiconductor device may further include a second polarization enhancement film between the ferroelectric film and the lower electrode. The first polarization enhancement film may have a third net polarization in a direction crossing the first net polarization and opposing the second net polarization.

In some embodiments, the semiconductor device may further include a dielectric film between the lower electrode and the first polarization enhancement film. A material of the dielectric film may be different than a material of the polarization enhancement film.

In some embodiments, the first net polarization may be in a direction that is perpendicular to an interface between the ferroelectric film and the first polarization enhancement film.

In some embodiments, a width of the ferroelectric film may be greater than a width of the upper electrode and less than a width of the lower electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
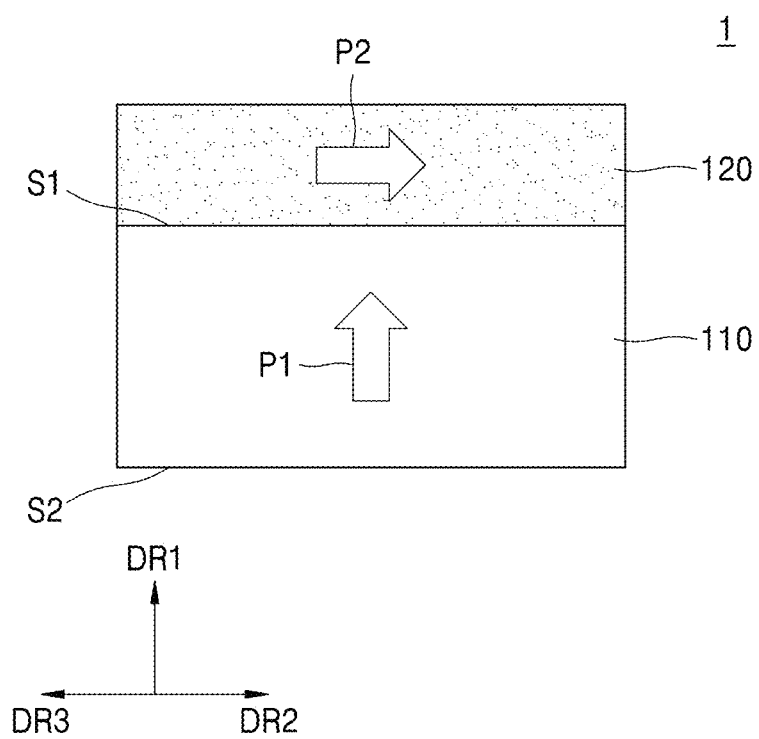
FIG. 1 is a cross-sectional view illustrating a ferroelectric structure according to an example embodiment.

Reference will now be made in detail to embodiments, examples of which are illustrated in the accompanying drawings. In the drawings, like reference numerals refer to like elements throughout, and the sizes of elements may be exaggerated for clarity of illustration. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the following description, when an element is referred to as being "above" or "on" another element, it may be directly on the other element while making contact with the other element or may be above the other element without making contact with the other element.

The terms of a singular form may include plural forms unless otherwise mentioned. It will be further understood that the terms "comprises" and/or "comprising" used herein specify the presence of stated features or elements, but do not preclude the presence or addition of one or more other features or elements.

In the present disclosure, terms such as unit or module may be used to denote a unit having at least one function or operation and implemented with hardware, software, or a combination of hardware and software.

FIG. 1 is a cross-sectional view illustrating a ferroelectric structure 1 according to an example embodiment.

Referring to FIG. 1, the ferroelectric structure 1 may include a ferroelectric film 110 and a polarization enhancement film 120. The ferroelectric film 110 may have a first net polarization P1. The first net polarization P1 may be the sum of polarizations that domains (not shown) of the ferroelectric film 110 have. The first net polarization P1 may follow a first direction DR1 oriented from the ferroelectric film 110 toward the polarization enhancement film 120. For example, the first direction DR1 may be perpendicular to the interface between the ferroelectric film 110 and the polarization enhancement film 120. The ferroelectric film 110 may include a ferroelectric substance. For example, the ferroelectric film 110 may include an $HfO_2$-based ferroelectric substance. The ferroelectric film 110 may include a dopant. For example, the ferroelectric film 110 may include at least one dopant selected from silicon (Si), aluminum (Al), zirconium (Zr), yttrium (Y), lanthanum (La), gadolinium (Gd), and strontium (Sr).

The polarization enhancement film 120 may be provided above the ferroelectric film 110. For example, the polarization enhancement film 120 may be in direct contact with a first surface S1 (e.g., an upper surface) of the ferroelectric film 110. The polarization enhancement film 120 may have a second net polarization P2. The second net polarization P2 may follow a second direction DR2 crossing the first direction DR1. For example, the second direction DR2 may be parallel to the interface between the polarization enhancement film 120 and the ferroelectric film 110. The second net polarization P2 may be a permanent polarization or permanent dipole that the polarization enhancement film 120 intrinsically has. For example, the polarization enhancement film 120 may include at least one of $In_2Se_3$, $MoS_2$, $MoSe_2$, $MoTe_2$, $WS_2$, and $WSe_2$. The ferroelectric film 110 may include a second surface S2 (e.g., lower surface) that may be opposite the first surface S1.

A ferroelectric substance may include domains. The domains may respectively have polarizations. The number of domains may naturally increase with time. This increase in the number of domains may change the direction and magnitude of the net polarization of the ferroelectric substance. In this case, the ferroelectric substance may not maintain a required net polarization. As a result, the ferroelectric characteristics of the ferroelectric substance may deteriorate.

In the present embodiment, however, the polarization enhancement film 120 may limit and/or prevent an increase in the number of domains in the ferroelectric film 110. Accordingly, the magnitude and direction of the first net polarization P1 of the ferroelectric film 110 may be maintained at required levels. As a result, the ferroelectric characteristics of the ferroelectric film 110 may be maintained, and thus reliability on the characteristics of the ferroelectric structure 1 may be improved.

Figure 2:
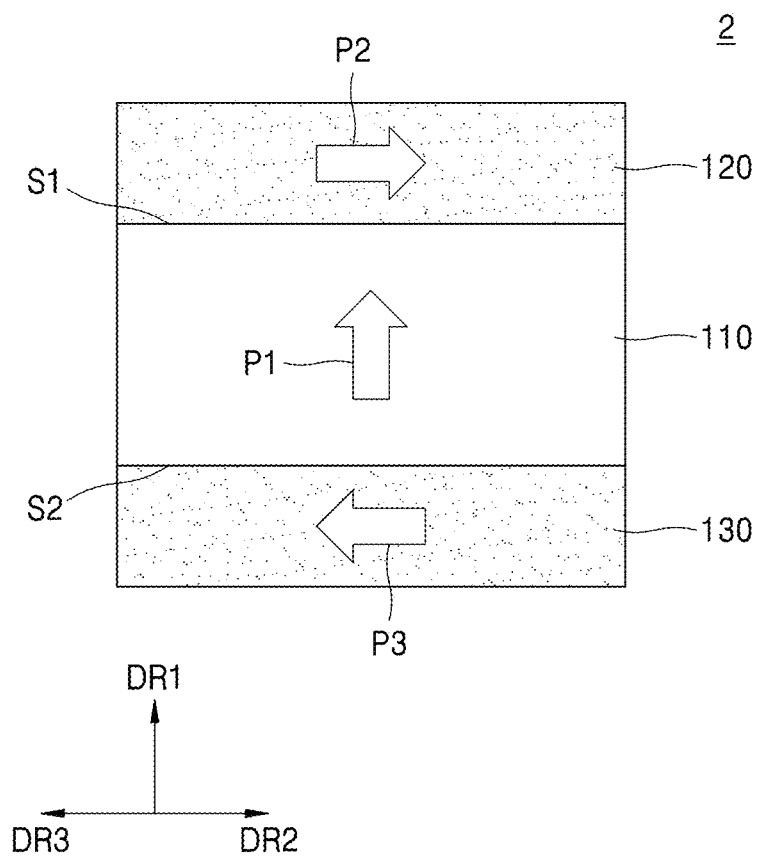
FIG. 2 is a cross-sectional view illustrating a ferroelectric structure according to an example embodiment.

FIG. 2 is a cross-sectional view illustrating a ferroelectric structure 2 according to an example embodiment. For brevity of description, substantially the same contents as those described with reference to FIG. 1 may not be described here.

Referring to FIG. 2, the ferroelectric structure 2 may include a ferroelectric film 110, a first polarization enhancement film 120, and a second polarization enhancement film 130. The ferroelectric film 110 and the first polarization enhancement film 120 may be substantially the same as the ferroelectric film 110 and the polarization enhancement film 120 described with reference to FIG. 1, respectively.

The second polarization enhancement film 130 may be provided on the ferroelectric film 110 at a side opposite the first polarization enhancement film 120. For example, the second polarization enhancement film 130 may be in direct contact with the second surface S2 (e.g., a lower surface) of the ferroelectric film 110. The second polarization enhancement film 130 may have a third net polarization P3. The third net polarization P3 may follow a third direction DR3 crossing the first direction DR1. For example, the third direction DR3 may be opposite the second direction DR2. The third net polarization P3 may be a permanent polarization or permanent dipole that the second polarization enhancement film 130 intrinsically has. For example, the second polarization enhancement film 130 may include at least one of $In_2Se_3$, $MoS_2$, $MoSe_2$, $MoTe_2$, $WS_2$, and $WSe_2$.

In the present embodiment, the first and second polarization enhancement films 120 and 130 may limit and/or prevent an increase in the number of domains of the ferroelectric film 110. Accordingly, the magnitude and direction of the first net polarization P1 of the ferroelectric film 110 may be maintained at required levels. As a result, the ferroelectric characteristics of the ferroelectric film 110 may be maintained, and thus reliability on the characteristics of the ferroelectric structure 2 may be improved.

Figure 3:
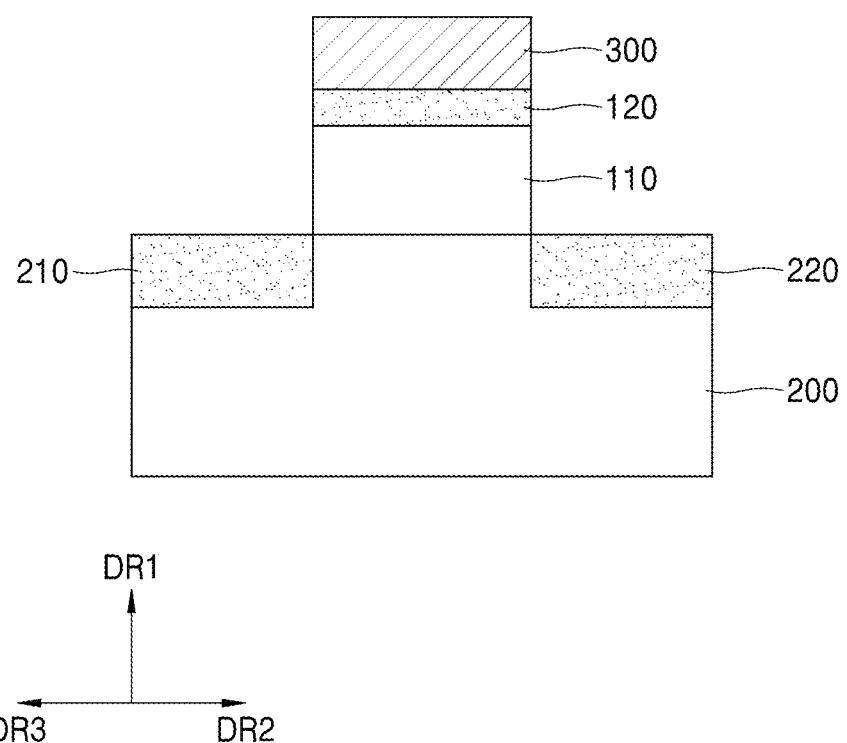
FIG. 3 is a cross-sectional view illustrating a semiconductor device according to an example embodiment.

FIG. 3 is a cross-sectional view illustrating a semiconductor device 11 according to an example embodiment.

Referring to FIG. 3, the semiconductor device 11 may include a substrate 200, a ferroelectric film 110, a polarization enhancement film 120, and an electrode film 300. The substrate 200 may include a semiconductor substrate. For example, the substrate 200 may include a silicon substrate, a germanium substrate, or a silicon-germanium substrate.

A first source/drain region 210 and a second source/drain region 220 may be provided in upper portions of the substrate 200. The first and second source/drain regions 210 and 220 may be spaced apart from each other in a second direction DR2 and a third direction DR3 that are parallel to an upper surface of the substrate 200. The first and second source/drain regions 210 and 220 may be formed by doping the upper portions of the substrate 200 with dopants.

The ferroelectric film 110 may be provided on the substrate 200. The ferroelectric film 110 may be arranged between the first and second source/drain regions 210 and 220. The ferroelectric film 110 may have a first net polarization (not shown). The first net polarization may be the sum of polarizations that domains of the ferroelectric film 110 have. The first net polarization may follow a first direction DR1 oriented from the ferroelectric film 110 toward the polarization enhancement film 120. For example, the first direction DR1 may be perpendicular to the upper surface of the substrate 200. The ferroelectric film 110 may include a ferroelectric substance. For example, the ferroelectric film 110 may include an $HfO_2$-based ferroelectric substance. The ferroelectric film 110 may include a dopant. For example, the ferroelectric film 110 may include at least one dopant selected from silicon (Si), aluminum (Al), zirconium (Zr), yttrium (Y), lanthanum (La), gadolinium (Gd), and strontium (Sr).

The polarization enhancement film 120 may be provided on the ferroelectric film 110. The polarization enhancement film 120 may have a second net polarization (not shown). The second net polarization may follow the second direction DR2 crossing the first direction DR1. For example, the second direction DR2 may be parallel to the upper surface of the substrate 200. The second net polarization may be a permanent polarization or permanent dipole that the polarization enhancement film 120 intrinsically has. For example, the polarization enhancement film 120 may include at least one of $In_2Se_3$, $MoS_2$, $MoSe_2$, $MoTe_2$, $WS_2$, and $WSe_2$.

The electrode film 300 may be provided on the polarization enhancement film 120. The electrode film 300 may include a conductive material. For example, the electrode film 300 may include a metal, a transparent electrode material, or graphene.

Threshold voltage characteristics of the semiconductor device 11 may be determined by the net polarization of the ferroelectric film 110. When the ferroelectric substance does not maintain a required net polarization, the semiconductor device 11 may not have required threshold voltage characteristics.

In the present embodiment, the polarization enhancement film 120 may limit and/or prevent an increase in the number of domains of the ferroelectric film 110. Accordingly, the magnitude and direction of the net polarization of the ferroelectric film 110 may be maintained at required levels. Since the ferroelectric characteristics of the ferroelectric film 110 are maintained, the semiconductor device 11 may have required threshold voltage characteristics. As a result, reliability on the semiconductor device 11 may be improved.

Figure 4:
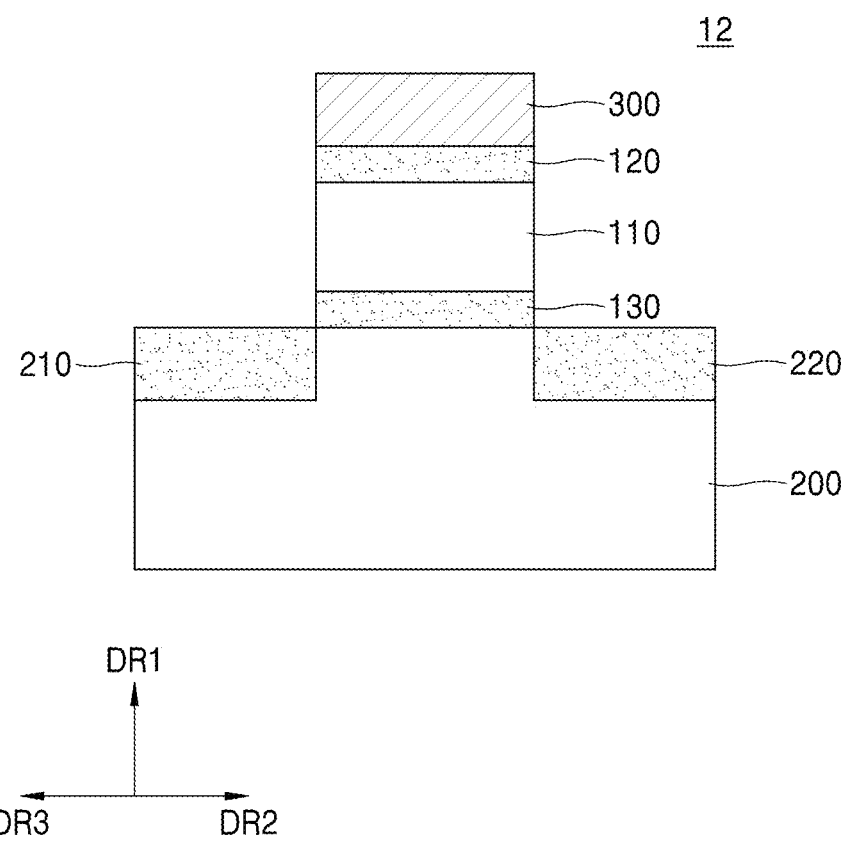
FIG. 4 is a cross-sectional view illustrating a semiconductor device according to an example embodiment.

FIG. 4 is a cross-sectional view illustrating a semiconductor device 12 according to an example embodiment. For brevity of description, substantially the same contents as those described with reference to FIG. 3 may not be described here.

Referring to FIG. 4, the semiconductor device 12 may include a substrate 200, a ferroelectric film 110, a first polarization enhancement film 120, a second polarization enhancement film 130, and an electrode film 300. The substrate 200, the ferroelectric film 110, the first polarization enhancement film 120, and the electrode film 300 may be substantially the same as the substrate 200, the ferroelectric film 110, the polarization enhancement film 120, and the electrode film 300 described with reference to FIG. 3, respectively.

The second polarization enhancement film 130 may be provided between the ferroelectric film 110 and the substrate 200. The second polarization enhancement film 130 may be spaced apart from the first polarization enhancement film 120 with the ferroelectric film 110 being therebetween. The second polarization enhancement film 130 may have a third net polarization (not shown). The third net polarization may follow a third direction DR3 crossing a first direction DR1. For example, the third direction DR3 may be opposite a second direction DR2. The third net polarization may be a permanent polarization or permanent dipole that the second polarization enhancement film 130 intrinsically has. For example, the second polarization enhancement film 130 may include at least one of $In_2Se_3$, $MoS_2$, $MoSe_2$, $MoTe_2$, $WS_2$, and $WSe_2$.

In the present embodiment, the first and second polarization enhancement films 120 and 130 may limit and/or prevent an increase in the number of domains of the ferroelectric film 110. Accordingly, the magnitude and direction of the net polarization of the ferroelectric film 110 may be maintained at required levels. Since the ferroelectric characteristics of the ferroelectric film 110 are maintained, the semiconductor device 12 may have required threshold voltage characteristics. As a result, reliability on the semiconductor device 12 may be improved.

Figure 5:
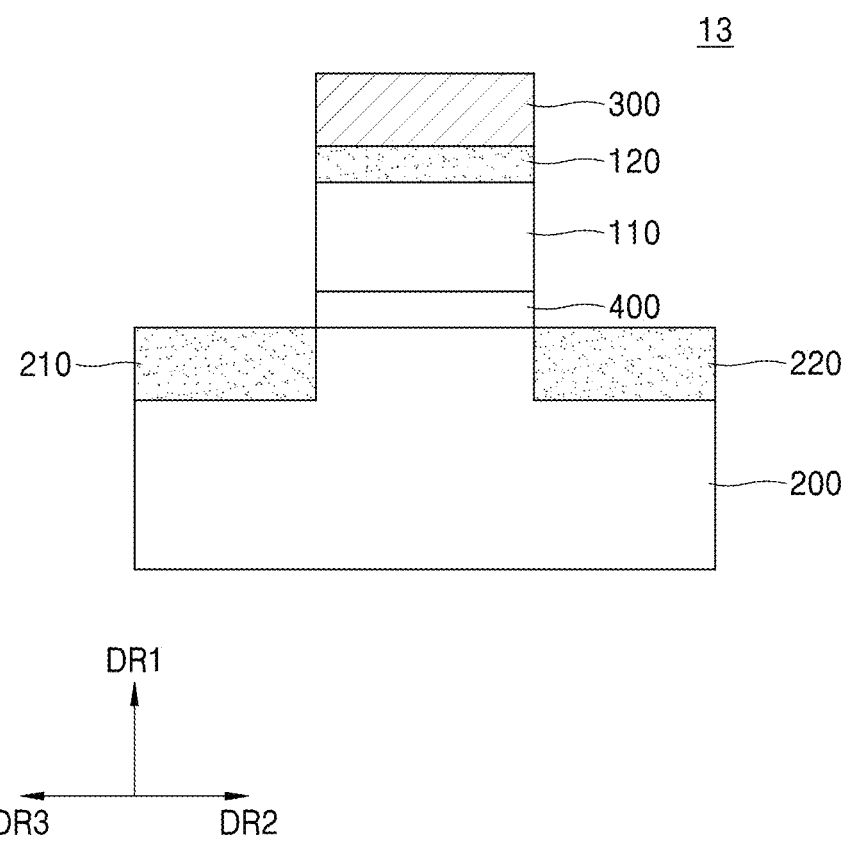
FIG. 5 is a cross-sectional view illustrating a semiconductor device according to an example embodiment.

FIG. 5 is a cross-sectional view illustrating a semiconductor device 13 according to an example embodiment. For brevity of description, substantially the same contents as those described with reference to FIG. 3 may not be described here.

Referring to FIG. 5, the semiconductor device 13 may include a substrate 200, a ferroelectric film 110, a first polarization enhancement film 120, a dielectric film 400, and an electrode film 300. The substrate 200, the ferroelectric film 110, the first polarization enhancement film 120, and the electrode film 300 may be substantially the same as the substrate 200, the ferroelectric film 110, the polarization enhancement film 120, and the electrode film 300 described with reference to FIG. 3, respectively.

The dielectric film 400 may be provided between the ferroelectric film 110 and the substrate 200. The dielectric film 400 may be spaced apart from the first polarization enhancement film 120 by the ferroelectric film 110. For example, the dielectric film 400 may include at least one of Si oxides, Al oxides, Hf oxides, Zr oxides, and 2D insulators (such as a hexagonal boron nitride (h-BN)).

The dielectric film 400 may decrease current leakage. As a result, the semiconductor device 13 may have improved characteristics.

Figure 6:
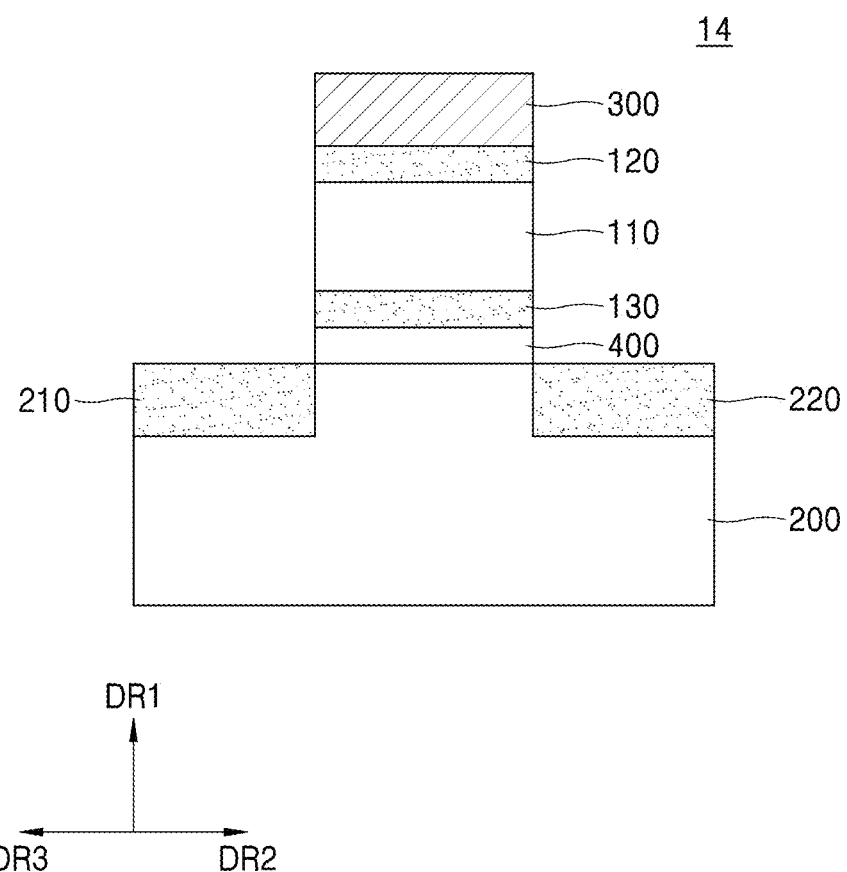
FIG. 6 is a cross-sectional view illustrating a semiconductor device according to an example embodiment.

FIG. 6 is a cross-sectional view illustrating a semiconductor device 14 according to an example embodiment. For brevity of description, substantially the same contents as those described with reference to FIG. 5 may not be described here.

Referring to FIG. 6, the semiconductor device 14 may include a substrate 200, a ferroelectric film 110, a first polarization enhancement film 120, a second polarization enhancement film 130, a dielectric film 400, and an electrode film 300. The substrate 200, the ferroelectric film 110, the first polarization enhancement film 120, the electrode film 300, and the dielectric film 400 may be substantially the same as the substrate 200, the ferroelectric film 110, the polarization enhancement film 120, the electrode film 300, and the dielectric film 400 described with reference to FIG. 5, respectively.

The second polarization enhancement film 130 may be provided between the ferroelectric film 110 and the dielectric film 400. The second polarization enhancement film 130 may be spaced apart from the first polarization enhancement film 120 with the ferroelectric film 110 being therebetween. The second polarization enhancement film 130 may have a third net polarization (not shown). The third second net polarization may follow a third direction DR3 crossing a first direction DR1. For example, the third direction DR3 may be opposite a second direction DR2. The third net polarization may be a permanent polarization or permanent dipole that the second polarization enhancement film 130 intrinsically has. For example, the second polarization enhancement film 130 may include at least one of $In_2Se_3$, $MoS_2$, $MoSe_2$, $MoTe_2$, $WS_2$, and $WSe_2$.

In the present embodiment, since the ferroelectric characteristics of the ferroelectric film 110 are maintained, the semiconductor device 14 may have required threshold voltage characteristics. Thus, reliability on the semiconductor device 14 may be improved. The dielectric film 400 may decrease current leakage. Thus, the semiconductor device 14 may have improved characteristics.

Figure 7:
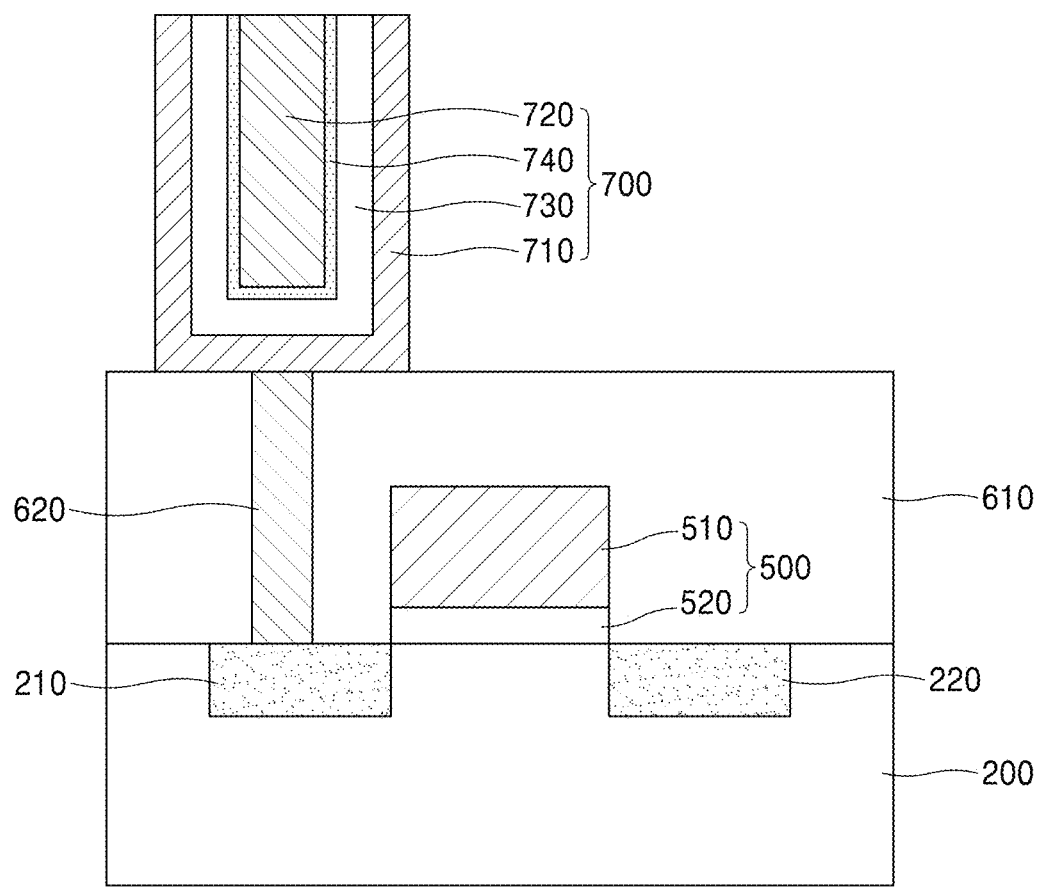
FIG. 7 is a cross-sectional view illustrating a semiconductor device according to an example embodiment.
Figure 7:
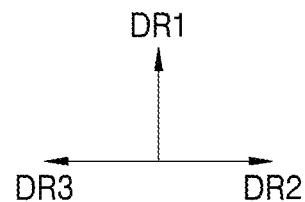

FIG. 7 is a cross-sectional view illustrating a semiconductor device 15 according to an example embodiment.

Referring to FIG. 7, the semiconductor device 15 may include a substrate 200, a gate structure 500, an interlayer insulation film 610, a contact 620, and a capacitor 700. The substrate 200 may include a semiconductor substrate. For example, the substrate 200 may include a silicon substrate, a germanium substrate, or a silicon-germanium substrate.

A first source/drain region 210 and a second source/drain region 220 may be provided in upper portions of the substrate 200. The first and second source/drain regions 210 and 220 may be spaced apart from each other in a second direction DR2 and a third direction DR3 that are parallel to an upper surface of the substrate 200. The first and second source/drain regions 210 and 220 may be formed by doping the substrate 200 with dopants.

The gate structure 500 may be provided on the substrate 200. The gate structure 500 may be provided between the first and second source/drain regions 210 and 220. The gate structure 500 may include a gate electrode 510 and a gate insulation film 520. The gate electrode 510 may include a conductive material. For example, the gate electrode 510 may include a metal or polysilicon.

The gate insulation film 520 may be arranged between the gate electrode 510 and the substrate 200. The gate insulation film 520 may insulate the gate electrode 510 from the substrate 200. The gate insulation film 520 may include an insulating material. For example, the gate insulation film 520 may include a Si oxide (for example, $SiO_2$) or an Al oxide (for example, $Al_2O_3$).

The interlayer insulation film 610 may be provided on the substrate 200 to cover the gate structure 500. The interlayer insulation film 610 may include an insulating material. For example, the interlayer insulation film 610 may include a Si oxide (for example, $SiO_2$) or an Al oxide (for example, $Al_2O_3$).

The capacitor 700 may be provided on the interlayer insulation film 610. The capacitor 700 may include a lower electrode 710, an upper electrode 720, a ferroelectric film 730, and a polarization enhancement film 740. The lower electrode 710 and the upper electrode 720 may be electrically separated from each other. The lower electrode 710 and the upper electrode 720 may be spaced apart from each other. The lower electrode 710 and the upper electrode 720 may include a conductive material. For example, the lower electrode 710 and the upper electrode 720 may include a metal.

The contact 620 may be provided between the lower electrode 710 and the first source/drain region 210. The contact 620 may penetrate the interlayer insulation film 610. The contact 620 may electrically connect the lower electrode 710 and the first source/drain region 210 to each other. The contact 620 may include a conductive material (for example, a metal).

The ferroelectric film 730 may be provided between the lower electrode 710 and the upper electrode 720. The ferroelectric film 730 may have a first net polarization (not shown). The first net polarization may be the sum of polarizations that domains of the ferroelectric film 730 have. The first net polarization may follow a direction oriented from the ferroelectric film 730 toward the polarization enhancement film 740. For example, the first net polarization may be perpendicular to an interface between the ferroelectric film 730 and the polarization enhancement film 740. The ferroelectric film 730 may include a ferroelectric substance. For example, the ferroelectric film 730 may include an $HfO_2$-based ferroelectric substance. The ferroelectric film 730 may include a dopant. For example, the ferroelectric film 730 may include at least one dopant selected from silicon (Si), aluminum (Al), zirconium (Zr), yttrium (Y), lanthanum (La), gadolinium (Gd), and strontium (Sr).

The polarization enhancement film 740 may be provided between the ferroelectric film 730 and the upper electrode 720. The polarization enhancement film 740 may have a second net polarization (not shown). The direction of the second net polarization may cross the direction of the first net polarization. For example, the second net polarization may be parallel to an interface between the ferroelectric film 730 and the polarization enhancement film 740. The second net polarization may be a permanent polarization or permanent dipole that the polarization enhancement film 740 intrinsically has. For example, the polarization enhancement film 740 may include at least one of $In_2Se_3$, $MoS_2$, $MoSe_2$, $MoTe_2$, $WS_2$, and $WSe_2$.

Capacitor characteristics of the semiconductor device 15 may be determined by the net polarization of the ferroelectric film 730. When the ferroelectric film 730 does not maintain a required net polarization, the capacitor 700 may not have required capacitance.

In the present embodiment, the polarization enhancement film 740 may limit and/or prevent an increase in the number of domains of the ferroelectric film 730. Accordingly, the magnitude and direction of the net polarization of the ferroelectric film 730 may be maintained at required levels. Since the ferroelectric characteristics of the ferroelectric film 730 are maintained, the semiconductor device 15 may have required capacitor characteristics. As a result, reliability on the semiconductor device 15 may be improved.

Figure 8:
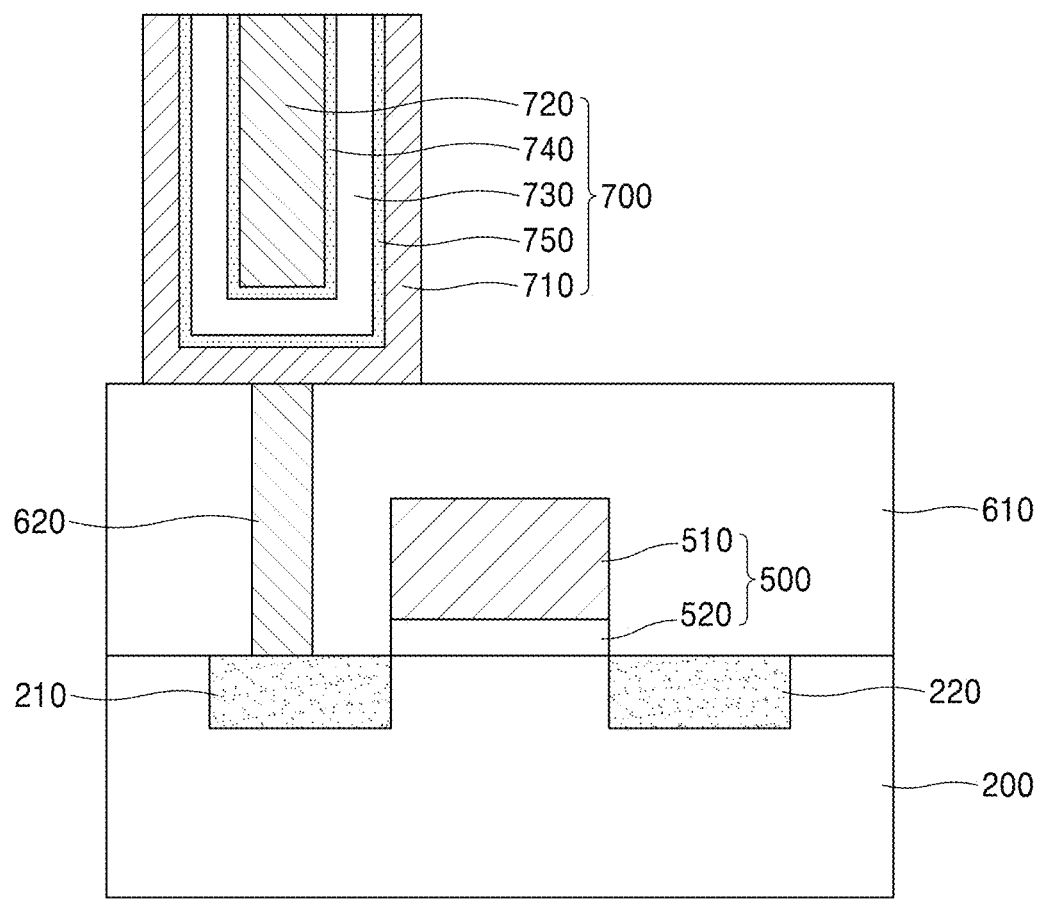
FIG. 8 is a cross-sectional view illustrating a semiconductor device according to an example embodiment.
Figure 8:
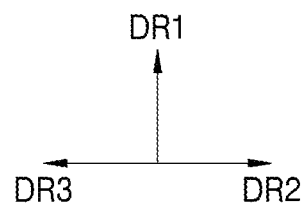

FIG. 8 is a cross-sectional view illustrating a semiconductor device 16 according to an example embodiment. For brevity of description, substantially the same contents as those described with reference to FIG. 7 may not be described here.

Referring to FIG. 8, the semiconductor device 16 may include a substrate 200, a gate structure 500, an interlayer insulation film 610, a contact 620, and a capacitor 700. Except for the configuration of the capacitor 700, the semiconductor device 16 of the present embodiment may be substantially the same as the semiconductor device 15 described with reference to FIG. 7.

The capacitor 700 may include a lower electrode 710, an upper electrode 720, a ferroelectric film 730, a first polarization enhancement film 740, and a second polarization enhancement film 750. The lower electrode 710, the upper electrode 720, the ferroelectric film 730, and the first polarization enhancement film 740 may be substantially the same as the lower electrode 710, the upper electrode 720, the ferroelectric film 730, and the polarization enhancement film 740 described with reference to FIG. 7, respectively.

The second polarization enhancement film 750 may be provided between the ferroelectric film 730 and the lower electrode 710. The second polarization enhancement film 750 may have a third net polarization (not shown). The direction of the third net polarization may cross the direction of a first net polarization. For example, the direction of the third net polarization may be opposite the direction of a second net polarization. The third net polarization may be a permanent polarization or permanent dipole that the second polarization enhancement film 750 intrinsically has. For example, the second polarization enhancement film 750 may include at least one of $In_2Se_3$, $MoS_2$, $MoSe_2$, $MoTe_2$, $WS_2$, and $WSe_2$.

In the present embodiment, the first and second polarization enhancement films 740 and 750 may limit and/or prevent an increase in the number of domains of the ferroelectric film 730. Accordingly, the magnitude and direction of the net polarization of the ferroelectric film 730 may be maintained at required levels. Since the ferroelectric characteristics of the ferroelectric film 730 are maintained, the semiconductor device 16 may have required capacitor characteristics. As a result, reliability on the semiconductor device 16 may be improved.

Figure 9:
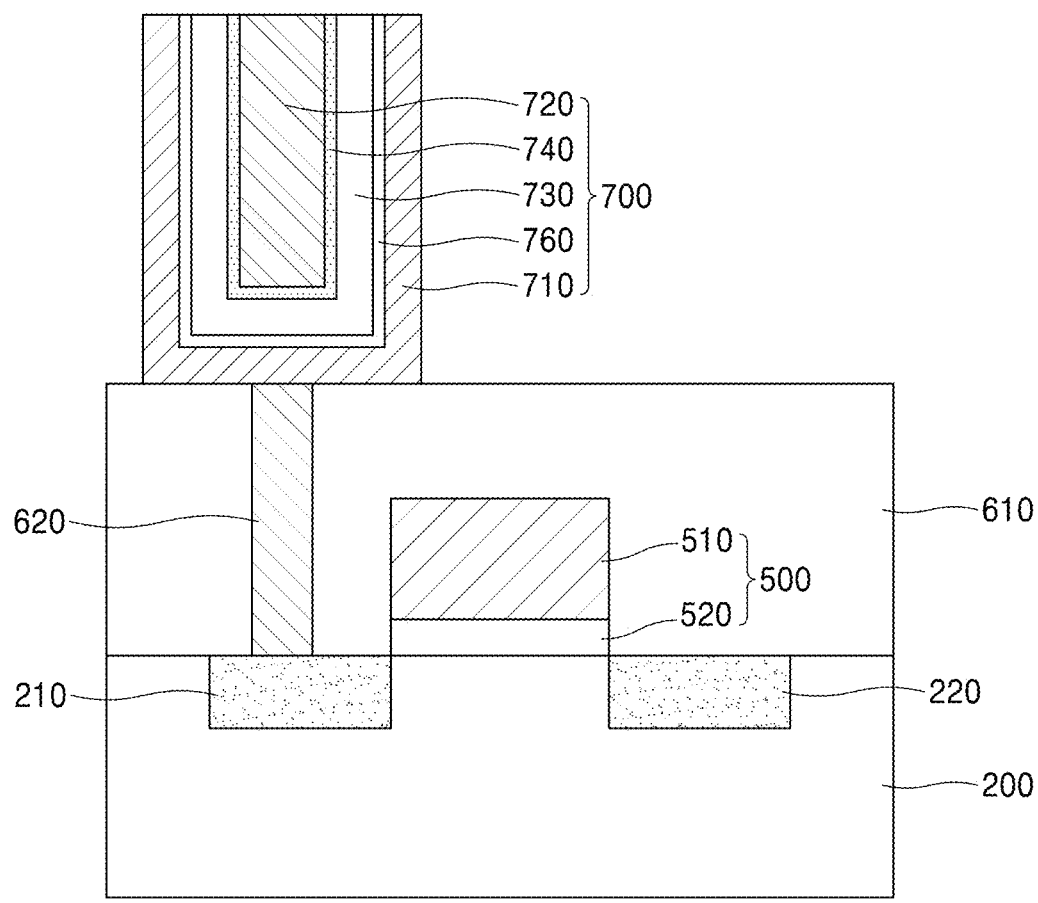
FIG. 9 is a cross-sectional view illustrating a semiconductor device according to an example embodiment.
Figure 9:
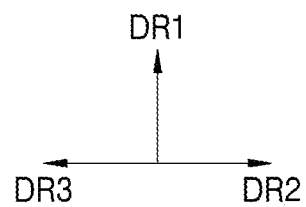

FIG. 9 is a cross-sectional view illustrating a semiconductor device 17 according to an example embodiment. For brevity of description, substantially the same contents as those described with reference to FIG. 7 may not be described here.

Referring to FIG. 9, the semiconductor device 17 may include a substrate 200, a gate structure 500, an interlayer insulation film 610, a contact 620, and a capacitor 700. Except for the configuration of the capacitor 700, the semiconductor device 17 of the present embodiment may be substantially the same as the semiconductor device 15 described with reference to FIG. 7.

The capacitor 700 may include a lower electrode 710, an upper electrode 720, a ferroelectric film 730, a polarization enhancement film 740, and a dielectric film 760. The lower electrode 710, the upper electrode 720, the ferroelectric film 730, and the polarization enhancement film 740 may be substantially the same as the lower electrode 710, the upper electrode 720, the ferroelectric film 730, and the polarization enhancement film 740 described with reference to FIG. 7, respectively.

The dielectric film 760 may be provided between the ferroelectric film 730 and the lower electrode 710. The dielectric film 760 may be spaced apart from the polarization enhancement film 740 with the ferroelectric film 730 being therebetween. For example, the dielectric film 760 may include at least one of Si oxides, Al oxides, Hf oxides, Zr oxides, and 2D insulators (such as a hexagonal boron nitride (h-BN)). The dielectric film 760 may reduce current leakage. As a result, the semiconductor device 17 may have improved characteristics.

Figure 10:
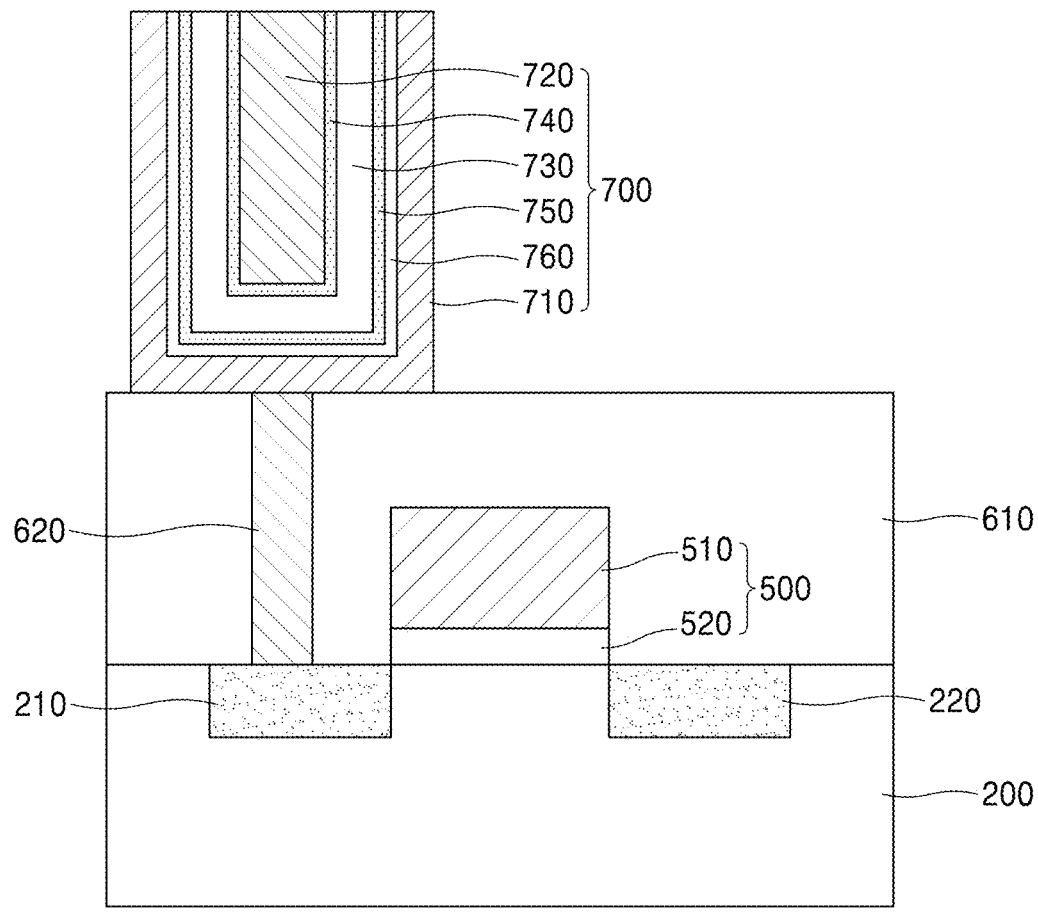
FIG. 10 is a cross-sectional view illustrating a semiconductor device according to an example embodiment.
Figure 10:
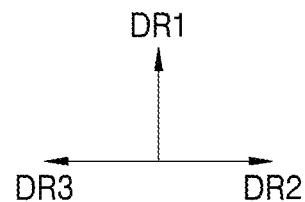

FIG. 10 is a cross-sectional view illustrating a semiconductor device 18 according to an example embodiment. For brevity of description, substantially the same contents as those described with reference to FIG. 8 may not be described here.

Referring to FIG. 10, the semiconductor device 18 may include a substrate 200, a gate structure 500, an interlayer insulation film 610, a contact 620, and a capacitor 700. Except for the configuration of the capacitor 700, the semiconductor device 18 of the present embodiment may be substantially the same as the semiconductor device 16 described with reference to FIG. 8.

The capacitor 700 may include a lower electrode 710, an upper electrode 720, a ferroelectric film 730, a first polarization enhancement film 740, a second polarization enhancement film 750, and a dielectric film 760. The lower electrode 710, the upper electrode 720, the ferroelectric film 730, and the first polarization enhancement film 740, and the second polarization enhancement film 750 may be substantially the same as the lower electrode 710, the upper electrode 720, the ferroelectric film 730, and the first polarization enhancement film 740, and the second polarization enhancement film 750 described with reference to FIG. 8.

The dielectric film 760 may be provided between the second polarization enhancement film 750 and the lower electrode 710. The second polarization enhancement film 750 and the lower electrode 710 may be spaced apart from each other by the dielectric film 760. For example, the dielectric film 760 may include at least one of Si oxides, Al oxides, Hf oxides, Zr oxides, and 2D insulators (such as a hexagonal boron nitride (h-BN)). The dielectric film 760 may decrease current leakage. As a result, the semiconductor device 18 may have improved characteristics. In the present embodiment, since the ferroelectric characteristics of the ferroelectric film 730 are maintained, the semiconductor device 18 may have required capacitor characteristics. Thus, reliability on the semiconductor device 18 may be improved.

Figure 11:
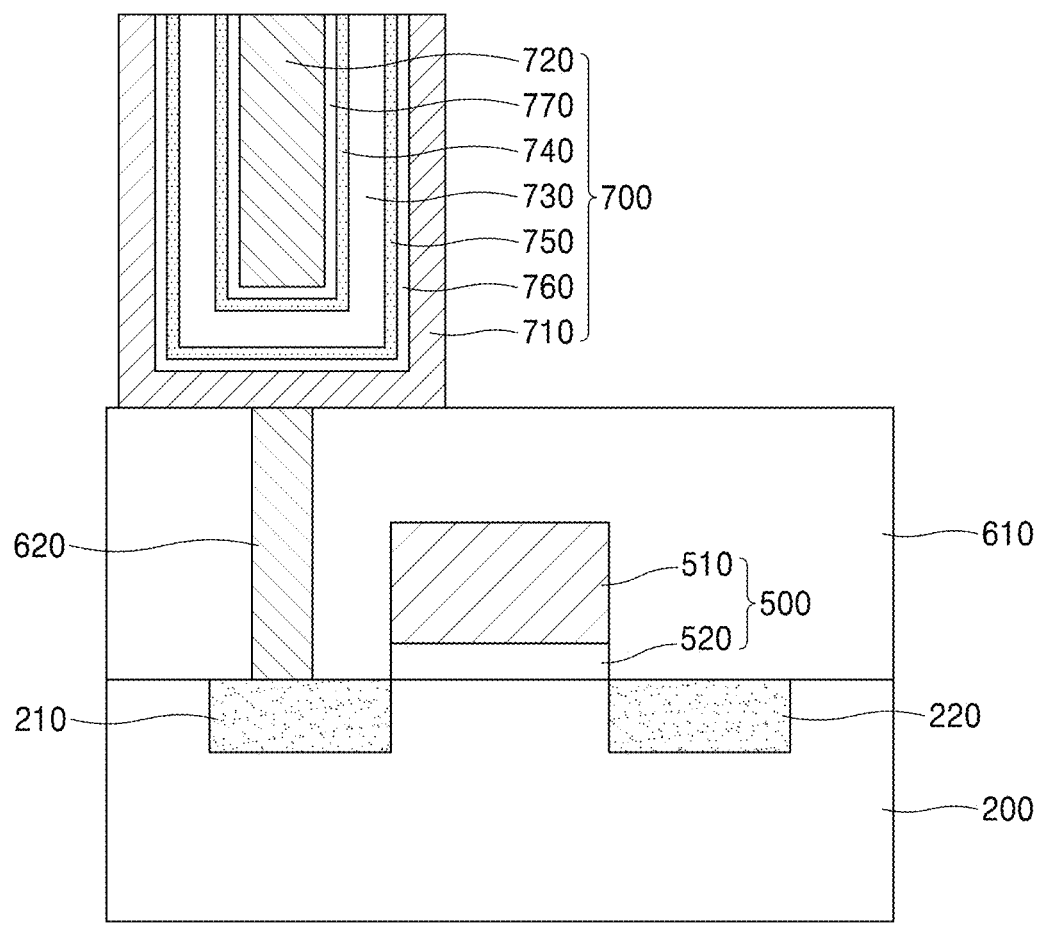
FIG. 11 is a cross-sectional view illustrating a semiconductor device according to an example embodiment.
Figure 11:
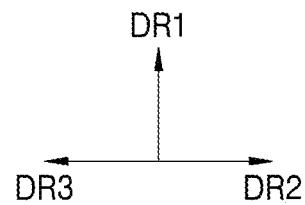

FIG. 11 is a cross-sectional view illustrating a semiconductor device 19 according to an example embodiment. For brevity of description, substantially the same contents as those described with reference to FIG. 10 may not be described here.

Referring to FIG. 11, the semiconductor device 19 may include a substrate 200, a gate structure 500, an interlayer insulation film 610, a contact 620, and a capacitor 700. Except for the configuration of the capacitor 700, the semiconductor device 19 of the present embodiment may be substantially the same as the semiconductor device 18 described with reference to FIG. 10.

The capacitor 700 may include a lower electrode 710, an upper electrode 720, a ferroelectric film 730, a first polarization enhancement film 740, a second polarization enhancement film 750, a first dielectric film 760, and a second dielectric film 770. The lower electrode 710, the upper electrode 720, the ferroelectric film 730, the first polarization enhancement film 740, the second polarization enhancement film 750, and the first dielectric film 760 may be substantially the same as the lower electrode 710, the upper electrode 720, the ferroelectric film 730, the first polarization enhancement film 740, the second polarization enhancement film 750, and the dielectric film 760 described with reference to FIG. 8, respectively.

The second dielectric film 770 may be provided between the first polarization enhancement film 740 and the upper electrode 720. The first polarization enhancement film 740 and the upper electrode 720 may be spaced apart from each other by the second dielectric film 770. The second dielectric film 770 may limit and/or prevent current leakage between the first polarization enhancement film 740 and the upper electrode 720.

The first and second dielectric films 760 and 770 may reduce current leakage. As a result, the semiconductor device 19 may have improved characteristics. In the present embodiment, since the ferroelectric characteristics of the ferroelectric film 730 are maintained, the semiconductor device 19 may have required capacitor characteristics. Thus, reliability on the semiconductor device 19 may be improved.

Figure 12:
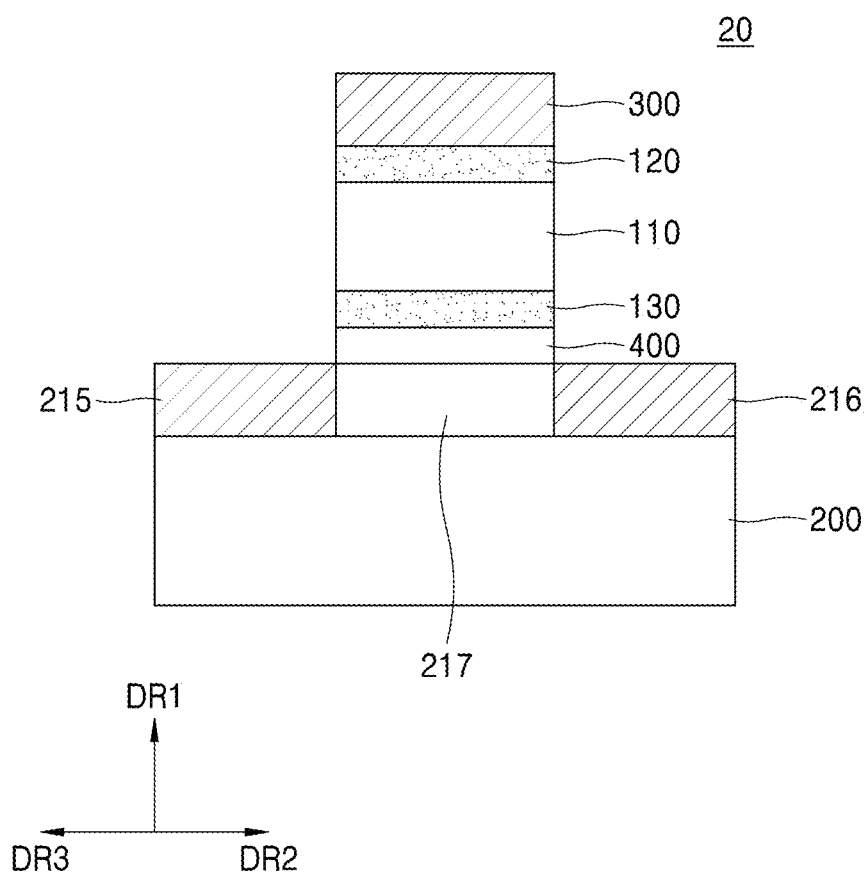
FIG. 12 is a cross-sectional view illustrating a semiconductor device according to an example embodiment.

FIG. 12 is a cross-sectional view illustrating a semiconductor device according to an example embodiment.

Referring to FIG. 12, the device 20 in FIG. 12 may be the same as the device 14 in FIG. 6, except the device 20 in FIG. 12 has source/drain electrodes 215/216 and a channel layer 217 that are separate from the substrate 200 instead of the source/drain regions 210/220 and channel depicted in FIG. 6. For the device 20 in FIG. 12, the channel layer 217 may include Si, Ge, SiGe, a Group III-V semiconductor, an organic semiconductor, an oxide semiconductor, a nitride semiconductor, an oxynitride semiconductor, a 2D material, a quantum dot, or a combination thereof. The source electrode 215 and the drain electrode 216 may include a conductive material, such as a metal, a metal compound, a conductive polymer, etc.

Figure 13:
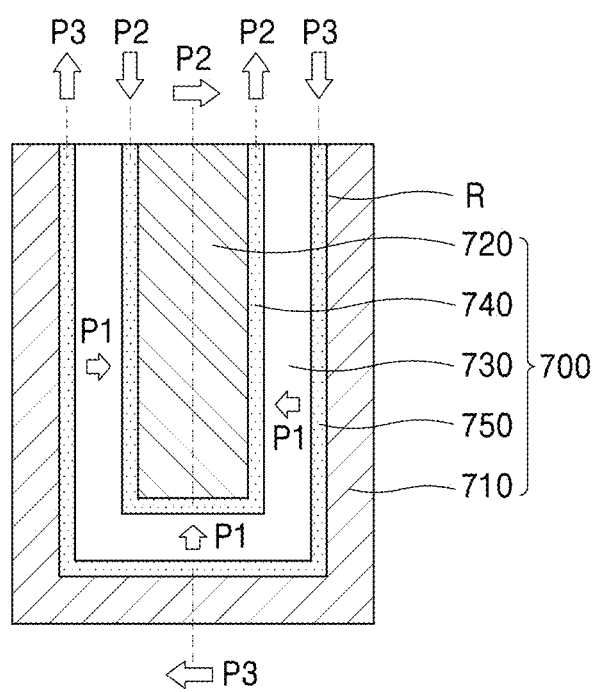
FIG. 13 is a diagram of polarization in a capacitor according to an example embodiment.

FIG. 13 is a diagram of polarization in a capacitor according to an example embodiment.

Referring to FIG. 13, the capacitor 700 may have a structure like the capacitor 700 described with reference to FIG. 8. As depicted in FIG. 13, in the capacitor 700, the lower electrode 710 may define a recess R. The second polarization enhancement film 750, ferroelectric film 730, first polarization enhancement film 740, and upper electrode 720 may be disposed in the recess R. A left portion, lower portion, and right portion of the ferroelectric film 730 may respectively include a first net polarization P1 directed toward the upper electrode 720. The first polarization enhancement film 740 may include a second net polarization P2, as shown in FIG. 13, where a direction of the second net polarization P2 crosses a direction the first net polarization P1 in regions of the ferroelectric film 730 and first polarization enhancement film 740 that are adjacent to each other. The second net polarization P2 may be in a downward direction in a left portion of the first polarization enhancement film 740, a rightward direction in a lower portion of the first polarization enhancement film 740, and in an upward direction in a right portion of the first polarization enhancement film 740. The second polarization enhancement film 750 include a third net polarization P3, as shown in FIG. 13, where a direction of the third net polarization P3 crosses a direction of the first net polarization P1 in regions of the ferroelectric film 730 and second polarization enhancement film 750 that are adjacent to each other. The third net polarization P3 may be in an upward direction in a left portion of the second polarization enhancement film 750, a leftward direction in a lower portion of the second polarization enhancement film 750, and in an downward direction in a right portion of the second polarization enhancement film 750.

Although the capacitor 700 in FIG. 13 has a structure like the capacitor 700 in FIG. 8, the capacitor 700 may be modified to have structures according to the capacitors 700 in FIGS. 7 and 9-11 so a detailed description thereof is omitted.

The present disclosure may provide ferroelectric structures having improved characteristics.

The present disclosure may provide semiconductor devices having improved characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
a substrate,
the substrate including a first source/drain region and a second source/drain region in upper portions of the substrate, and
the first source/drain region and the second source/drain region being spaced apart from each other;
a ferroelectric film on a portion of the substrate between the first source/drain region and the second source/drain region,
the ferroelectric film having a first net polarization in a first direction oriented from the ferroelectric film toward a first polarization enhancement film;
the first polarization enhancement film on the ferroelectric film,
the first polarization enhancement film having a second net polarization in a second direction crossing the first direction; and
an electrode film directly on the first polarization enhancement film,
wherein the first direction is substantially perpendicular to an interface between the ferroelectric film and the first polarization enhancement film, and
wherein the second direction is substantially parallel to an interface between the ferroelectric film and the first polarization enhancement film,
wherein the first polarization enhancement film includes at least one of $In_2Se_3$, $MoS_2$, $MoSe_2$, $MoTe_2$, $WS_2$, and $WSe_2$.

2. A ferroelectric structure comprising:
a first polarization enhancement film;
an electrode film directly on the first polarization enhancement film; and
a ferroelectric film having a first surface facing the first polarization enhancement film and a second surface opposite the first surface, wherein
the ferroelectric film has a first net polarization in a first direction oriented from the ferroelectric film toward the first polarization enhancement film,
the first polarization enhancement film has a second net polarization in a second direction crossing the first direction, and
the second surface of the ferroelectric film does not directly contact a dielectric film,
wherein the first direction is substantially perpendicular to an interface between the ferroelectric film and the first polarization enhancement film, and
wherein the second direction is substantially parallel to an interface between the ferroelectric film and the first polarization enhancement film,
wherein the first polarization enhancement film includes at least one of $In_2Se_3$, $MoS_2$, $MoSe_2$, $MoTe_2$, $WS_2$, and $WSe_2$.

3. The ferroelectric structure of claim 2, further comprising:
a second polarization enhancement film contacting the second surface of the ferroelectric film, wherein
the second surface of the ferroelectric film is on the second polarization enhancement film, and
the second polarization enhancement film has a third net polarization in a third direction that is opposite the second direction.

4. A semiconductor device comprising:
a substrate;
the ferroelectric structure of claim 2 on the substrate;
a second polarization enhancement film between the substrate and the ferroelectric film,
wherein the second polarization enhancement film has a third net polarization in a third direction opposite the second direction.

5. The semiconductor device of claim 4, wherein
the first polarization enhancement film directly contacts the first surface of the ferroelectric film, and
the second polarization enhancement film directly contacts the second surface of the ferroelectric film.

6. The semiconductor device of claim 4, further comprising:
a dielectric film between the second polarization enhancement film and the substrate,
wherein a material of the dielectric film is different than a material of the ferroelectric film.

7. The semiconductor device of claim 4, further comprising:
a dielectric film between the substrate and the ferroelectric film, wherein
the dielectric film is spaced apart from the ferroelectric film, and
a material of the dielectric film is different than a material of the ferroelectric film.

8. A semiconductor device comprising:
the ferroelectric structure of claim 2;
a substrate connected to the ferroelectric structure,
- the substrate including a first source/drain region and a second source/drain region in upper portions of the substrate, and
- the first source/drain region and the second source/drain region being spaced apart from each other;

a gate structure on the substrate; and
a capacitor electrically connected to the first source/drain region,
- the capacitor including a lower electrode, an upper electrode, and the ferroelectric structure between the lower electrode and the upper electrode,
- the electrode film is the upper electrode, and
- the first polarization enhancement film being between the ferroelectric film and the upper electrode.

9. The semiconductor device of claim 8, further comprising:
a second polarization enhancement film between the ferroelectric film and the lower electrode,
wherein the second polarization enhancement film has a third net polarization in a direction that is opposite the first net polarization.

10. The semiconductor device of claim 9, wherein the first polarization enhancement film and the second polarization enhancement film directly contact opposite surfaces of the ferroelectric film, respectively.

11. The semiconductor device of claim 9, further comprising:
a first dielectric film between the second polarization enhancement film and the lower electrode,
wherein a material of the first dielectric film is different than a material of the ferroelectric film.

12. A semiconductor device comprising:
a lower electrode;
an upper electrode on the lower electrode; and
the ferroelectric structure of claim 2 between the lower electrode and the upper electrode, wherein
the electrode film is the upper electrode.

13. The semiconductor device of claim 12, further comprising:
a second polarization enhancement film between the ferroelectric film and the lower electrode, the first polarization enhancement film having a third net polarization in a direction crossing the first net polarization and opposing the second net polarization.

14. The semiconductor device of claim 12, further comprising:
a dielectric film between the lower electrode and the first polarization enhancement film, wherein
a material of the dielectric film is different than a material of the first polarization enhancement film.

15. A semiconductor device, comprising:
a first polarization enhancement film;
an electrode film on the first polarization enhancement film; and
a ferroelectric film having a first surface facing the first polarization enhancement film and a second surface opposite the first surface, wherein
the ferroelectric film has a first net polarization in a first direction oriented from the ferroelectric film toward the first polarization enhancement film,
the first polarization enhancement film has a second net polarization in a second direction crossing the first direction, and
the second surface of the ferroelectric film does not directly contact a dielectric film,
wherein the first direction is substantially perpendicular to an interface between the ferroelectric film and the first polarization enhancement film, and
wherein the second direction is substantially parallel to an interface between the ferroelectric film and the first polarization enhancement film,
wherein the first polarization enhancement film includes at least one of $In_2Se_3$, $MoS_2$, $MoSe_2$, $MoTe_2$, $WS_2$, and $WSe_2$, wherein
the semiconductor device does not include an insulating layer between the electrode film and the first polarization enhancement film.

* * * * *